United States Patent [19]

You

[11] Patent Number: 5,326,932
[45] Date of Patent: Jul. 5, 1994

[54] SEMICONDUCTOR PACKAGE

[75] Inventor: Jin Sung You, Choongcheongbook, Rep. of Korea

[73] Assignee: Goldstar Electron Co., Ltd., Rep. of Korea

[21] Appl. No.: 964,718

[22] Filed: Oct. 22, 1992

[30] Foreign Application Priority Data

Jan. 14, 1992 [KR] Rep. of Korea ............... 421/1992

[51] Int. Cl.$^5$ .......................................... H01L 23/02
[52] U.S. Cl. ................................ 174/52.4; 361/730;
361/760; 361/752; 174/259; 174/260; 257/690
[58] Field of Search .................. 174/52.2, 52.4, 258,
174/259, 260; 361/392, 394, 395, 397, 399, 400;
257/678, 687, 690, 693, 701, 704

[56] References Cited

U.S. PATENT DOCUMENTS

| 5,136,366 | 8/1992 | Worp et al. ........................ 357/72 |
| 5,138,436 | 8/1992 | Koepf . |
| 5,139,969 | 8/1992 | Mori . |
| 5,153,379 | 10/1992 | Guzuk et al. ..................... 174/35 R |
| 5,153,385 | 10/1992 | Juskey et al. ..................... 174/260 |
| 5,159,434 | 10/1992 | Kohno et al. . |
| 5,166,772 | 11/1992 | Soldner et al. .................... 257/659 |

FOREIGN PATENT DOCUMENTS 0516170 12/1992 European Pat. Off. .

OTHER PUBLICATIONS

Papageorge, M., et al., "Double Layer Recessed Hybrid Flip Chip on Board", *Motorola Technical Developments*, vol. 11, pp. 158-159 (1990).

"Thin Film Module", *IBM Technical Disclosure Bulletin*, vol. 31, No. 8, pp. 135-138 (1989).
Patent Abstracts of Japan, vol. 14, No. 117 (E-898) (1990), JP 1—313969.
Patent Abstracts of Japan, vol. 15, No. 295 (E-1094) (1991), JP 3-105924.
Patent Abstracts of Japan, vol. 15, No. 383 (E-1116) (1991), JP 3-154344.
Patent Abstracts of Japan, vol. 15, No. 315 (E-1099) (1991), JP 3-116838.

Primary Examiner—Leo P. Picard
Assistant Examiner—Bot Ledinh
Attorney, Agent, or Firm—Scully, Scott, Murphy & Presser

[57] ABSTRACT

A semiconductor package comprising a semiconductor chip received in and attached to a cavity of a base made of a ceramic or aluminum, by means of an adhesive, a lid fixedly attached to the upper surface of the semiconductor chip, the lid having a plurality of solder bumps being in contact with bonding pads of the semiconductor chip and a plurality of metal contacts formed on the solder bumps of the lid. The lid comprises an insulating polyimide film or a rectangular plate made of a nonconductive ceramic material. The semiconductor package eliminates the use of a lead frame and metal wires, thereby enabling the manufacture thereof to be simplified. It also achieves a simplification, a lightness, a thinness, a compactness in construction. With the simplified construction, a reduction in manufacture cost and an improvement in productivity are achieved. In manufacturing semiconductor devices, the semiconductor package also provides an improvement in the degree of dense integration.

5 Claims, 2 Drawing Sheets

SEMICONDUCTOR PACKAGE

BACKGROUND OF THE INVENTION

1. Field of the Invention

The present invention relates to a semiconductor package, and more particularly to a semiconductor package with a structure capable of eliminating the use of a lead frame and metal wires, thereby simplifying the manufacture and construction of semiconductor devices and achieving an application to multi-pin constructions of integrated circuits, a simplification, a lightness, a thinness, a compactness in construction and an improvement in the degree of dense integration.

2. Description of the Prior Art

Referring to FIGS. 1 and 2, there is illustrated a general semiconductor package. As shown in the drawings, the semiconductor package comprises a lead frame having a paddle 1 to which a semiconductor chip 3 is fixedly attached by means of an adhesive 2. The lead frame also has a plurality of inner leads 4 which are electrically connected to a plurality of bonding pads 3a formed at opposite side edges of the semiconductor chip 3 by means of metal wires, respectively. The semiconductor chip 3 and the inner leads 4 of lead frame are molded with an epoxy molding compound 6, to form a sealed mold body. The lead frame also has a plurality of outer leads 7 which are protruded outwardly of the mold body and bent to have a certain shape.

According to the recent tendency of providing packages having more light, thin, simple and compact structures, there have been proposed semiconductor packages comprising a lead frame having no paddle. In such semiconductor packages, a semiconductor chip 3 is attached to inner leads 4 of the lead frame, by means of an insulating tape 8, as shown in FIGS. 3 and 4. These semiconductor packages are classified into semiconductor packages of a chip on lead (COL) type wherein the semiconductor chip 3 is laid on the inner leads 4 of lead frame as shown in FIG. 3 and semiconductor packages of a lead on chip (LOC) type wherein the inner leads 4 of lead frame are laid on the semiconductor chip 3 as shown in FIG. 4.

In FIGS. 3 and 4, the same constituting elements as those of the general package shown in FIG. 1 are denoted by the same reference numerals and their detailed description is omitted.

However, all of the above-mentioned various semiconductor packages are manufactured by using a lead frame. That is, they should have inner leads and require a bonding work using metal wires 5. As a result, they have a disadvantage of an increase in size, namely, occupation area. Additional troubles may also occur due to the materials used for constructing the structure of semiconductor package. For example, a breakage of semiconductor package may occur due to the thermal expansion coefficient difference among constituting materials such as a silicon, an adhesive, a metal for lead frame and an epoxy molding compound. Due to the bonding work using metal wires, a degradation in electrical characteristic of the semiconductor chip and a difficulty in wire bonding may occur. Consequently, the above-mentioned conventional constructions have a difficulty in manufacture.

SUMMARY OF THE INVENTION

Therefore, an object of the invention is to provide a semiconductor package capable of eliminating the above-mentioned disadvantages encountered in the prior arts.

Another object of the invention is to provide a semiconductor package capable of eliminating the use of a lead frame and the bonding using metal wires by using contacts formed at bond pads of a semiconductor chip as external contact terminals, thereby achieving a simplification, a lightness, a thinness, a compactness in construction and an improvement in the degree of dense integration.

In accordance with the present invention, these object can be accomplished by providing a semiconductor package comprising: a semiconductor chip provided at its opposite side edges with a plurality of bonding pads; a base provided with a cavity in which the semiconductor chip is seated; a lid fixedly attached to an upper surface of the semiconductor chip received in the cavity, the lid having a plurality of solder bumps being in contact with the bonding pads, respectively; and a plurality of metal contacts formed on the solder bumps of the lid, respectively.

The semiconductor package of the present invention eliminates the use of a lead frame and metal wires, thereby enabling the manufacture thereof to be simplified. It is also possible to reduce troubles caused by the thermal expansion coefficient difference among constituting materials. The semiconductor package of the present invention also achieves a simplification, a lightness, a thinness, a compactness in construction. It can be also advantageously applied to multipin constructions of integrated circuits.

BRIEF DESCRIPTION OF THE DRAWINGS

Other objects and aspects of the invention will become apparent from the following description of embodiments with reference to the accompanying drawings in which:

FIGS. 3 and 4 are partially broken perspective views of a semiconductor package comprising a lead frame having no paddle for achieving a simplification, a lightness, a thinness, a compactness in construction, wherein FIG. 3 shows a semiconductor package of the COL type and FIG. 4 shows a semiconductor package of the LOC type; and FIGS. 5 and 6 are sectional views of different semiconductor packages in accordance with the present invention, wherein FIG. 5 shows a semiconductor package with a structure using an insulating polyimide film and FIG. 6 shows a semiconductor package with a structure using a nonconductive ceramic lid.

DESCRIPTION OF THE PREFERRED EMBODIMENTS

Figure 1:
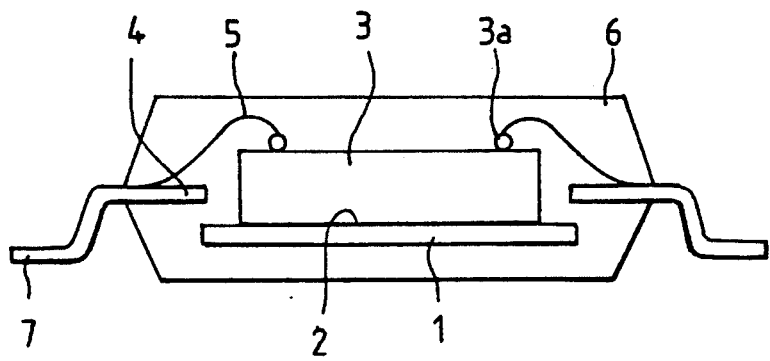
FIGS. 1 and 2 are a sectional view and a partially broken perspective view of a general semiconductor package, respectively.
Figure 2:
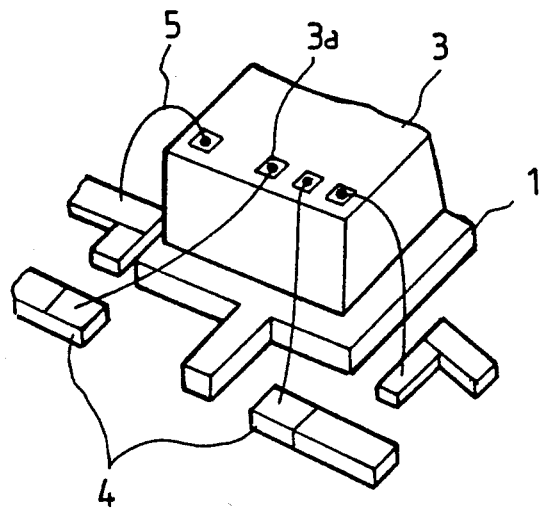
Figure 3:
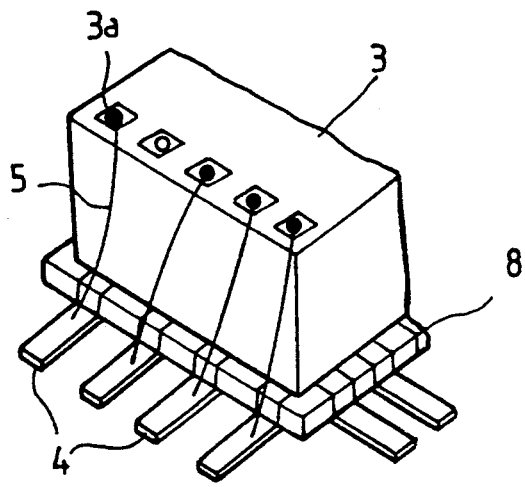
Figure 4:
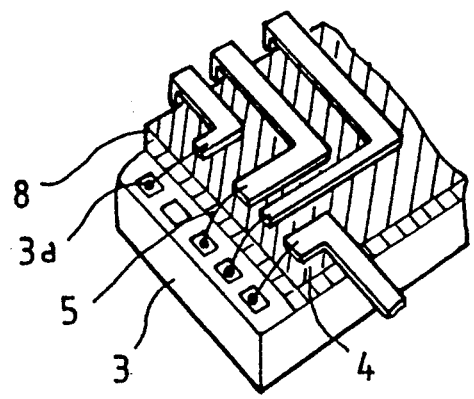
Figure 5:
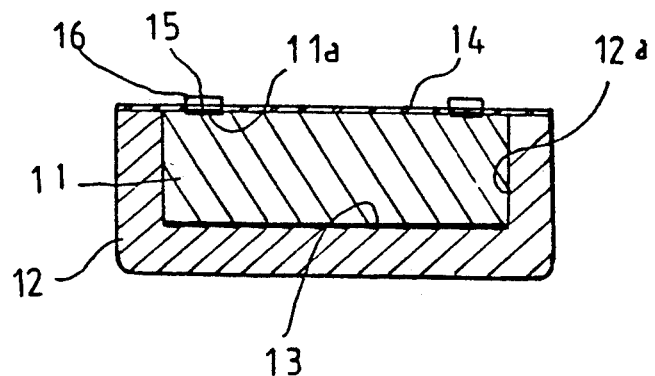
Figure 6:
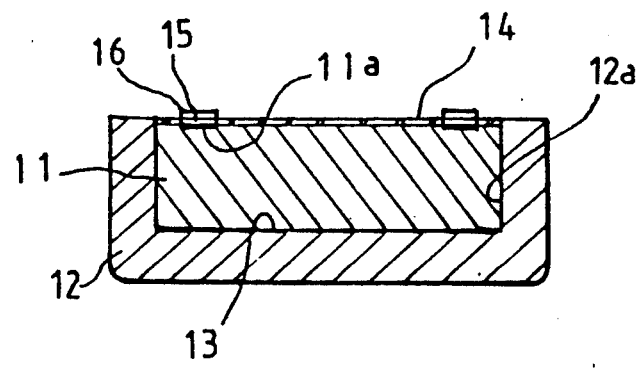

FIGS. 5 and 6 are sectional views of different semiconductor packages in accordance with the present invention. FIG. 5 illustrates a semiconductor package with a structure using an insulating polyimide film, whereas FIG. 6 illustrates a semiconductor package with a structure using a nonconductive ceramic lid.

As shown in FIGS. 5 and 6, each semiconductor package of the present invention comprises a semiconductor chip 11 having a plurality of bonding pads 11a at opposite side edges of its upper surface and a base 12 made of ceramic or aluminum and provided with a cavity 12a in which the semiconductor chip 11 is received. Over the bottom surface of cavity 12a, an adhesive 13 is coated for attaching the semiconductor chip 11 to the cavity 12a. To the upper surface of semiconductor chip 11 is attached a lid 14 of a nonconductive material. The lid 14 has a plurality of solder bumps 15 each being in contact with each corresponding bonding pad 11a. Each semiconductor package also comprises a plurality of metal contacts 16 each formed on each corresponding solder bump 15.

Preferably, the adhesive 13 comprises a polyimide or epoxy based insulating tape. Of course, other kinds of adhesives may be used.

The lid 14 may comprise an insulating polyimide film shown in FIG. 5 or a rectangular nonconductive ceramic plate shown in FIG. 6. It may be also made of other nonconductive materials which are not to be construed to limit the scope of the present invention.

On the other hand, the material of metal contacts 16 may include conductive materials such as aluminum and aluminum alloys.

For assembling the semiconductor package with the above-mentioned structure according to the present invention, first, the semiconductor chip 11 is received in the cavity 12a of the base 12 and fixedly attached to the bottom surface of cavity 12a by means of the adhesive 13. Thereafter, the lid 14 is attached to the upper surface of semiconductor chip 11. At this time, the bonding pads 11a of semiconductor chip 11 are electrically connected to the corresponding solder bumps 15 of lid 14 in a conventional manner. A plurality of metal contacts 16 of a conductive metal are then formed on the solder bumps 15, respectively. The semiconductor package obtained according to the above procedure is mounted on the surface of a printed circuit substrate such that its metal contacts 16 are aligned with metal lines of the printed circuit substrate, respectively.

As apparent from the above description, the present invention provides a semiconductor package capable of eliminating the use of a lead frame and metal wires. Accordingly, it is possible to simplify the manufacture of semiconductor packages and thus achieve a reduction in manufacture cost and an improvement in productivity, over the prior arts. Furthermore, there is an effect of reducing troubles caused by the thermal expansion coefficient difference among constituting materials. The semiconductor package of the present invention also achieves a simplification, a lightness, a thinness, a compactness in construction. It can be also advantageously applied to multi-pin constructions of integrated circuits. In manufacturing semiconductor devices, the semiconductor package also provides an improvement in the degree of dense integration.

What is claimed is:

1. A semiconductor package comprising:
   a semiconductor chip provided on its upper surface at opposite side edges thereof with a plurality of bonding pads;
   a base provided with a cavity in which the semiconductor chip is seated;
   a lid fixedly attached to an upper surface of the semiconductor chip received in the cavity for electrically insulating the semiconductor package;
   a plurality of solder bumps formed in said lid and being disposed on and in direct contact with the bonding pads, respectively;
   a plurality of metal contacts formed on and in direct contact with the solder bumps of the lid, respectively; and
   said semiconductor chip being fixedly attached to the cavity of the base by an adhesive material.

2. A semiconductor package in accordance with claim 1, wherein the adhesive is made of a polyimide material or an epoxy material.

3. A semiconductor package in accordance with claim 1, wherein the base is made of a ceramic or an aluminum.

4. A semiconductor package in accordance with claim 1, wherein the lid comprises a polyimide film.

5. A semiconductor package in accordance with claim 1, wherein the lid is made of a ceramic.

* * * * *